United States Patent [19]

Senger

[11] 4,263,521
[45] Apr. 21, 1981

[54] DIFFERENTIAL SAMPLE AND HOLD CIRCUIT

[75] Inventor: Stephen J. Senger, Jamestown, N. Dak.

[73] Assignee: The United States of America as represented by the Secretary of the Navy, Washington, D.C.

[21] Appl. No.: 47,187

[22] Filed: Jun. 8, 1979

Related U.S. Application Data

[62] Division of Ser. No. 913,624, Jun. 8, 1978, Pat. No. 4,178,594.

[51] Int. Cl.³ ............................................. G11C 27/02
[52] U.S. Cl. ..................................... 307/353; 328/151
[58] Field of Search ............... 307/351, 352, 353, 251; 328/151

[56] References Cited

U.S. PATENT DOCUMENTS

| | | | |
|---|---|---|---|
| 3,586,880 | 6/1971 | Fitzwater, Jr. | 328/151 X |
| 3,696,305 | 10/1972 | Mitchell et al. | 307/353 X |
| 3,750,036 | 7/1973 | Burrows et al. | 307/352 X |
| 3,820,033 | 6/1974 | Iwata | 328/151 |

Primary Examiner—John Zazworsky
Attorney, Agent, or Firm—Richard S. Sciascia; Joseph M. St. Amand; W. C. Daubenspeck

[57] ABSTRACT

An angle servo preamplifier for use in the tracking antenna servo drive system of a precision tracking radar system. The angle servo preamplifier processes tracking error signals indicative of tracking antenna pointing errors with respect to a target. The preamplifier is comprised of an input differential amplifier stage, a phase control stage, a sample and hold stage and a power amplifier stage. In addition, interfacing circuitry is included for coupling the preamplifier to the azimuth/secant correction system of the tracking radar system. The sample and hold stage includes "deglitching" circuitry for suppressing sampling/switching transients. And, to accommodate a bipolar tracking error signal while utilizing a single voltage supply, the power amplifier stage performs d.c. level translation.

3 Claims, 4 Drawing Figures

DIFFERENTIAL SAMPLE AND HOLD CIRCUIT

This is a division of application Ser. No. 913,624 filed June 8, 1978 now U.S. Pat. No. 4,178,594 issued Dec. 11, 1979.

BACKGROUND OF THE INVENTION

The present invention relates to a preamplifier for the antenna servo drive system of a precision tracking radar system, and more particularly to such a preamplifier incorporating solid state circuitry.

Precision tracking radar systems include an antenna servo drive system to continuously reposition the tracking antenna on target. Heretofore, the operational range requirements for the servo-drive amplifiers associated with such antenna servo drive systems have necessitated the use of vacuum tube components. Specifically, for the antenna angle servo preamplifier in such an antenna servo drive system, the required operating linear response range, typically five to six orders of magnitude, has heretofore precluded the use of solid state active components. This has resulted in a design trade-off between operational response range and the reliability and stability afforded by solid state circuitry. However, recent improvements in the fabrication and design of solid state components, with an attendant improvement in active linear response range, have made the incorporation of these components in an angle servo preamplifier for a precision tracking radar system feasible.

SUMMARY OF THE INVENTION

It is therefore an object of the present invention to provide, in the antenna servo drive system of a precision tracking radar system, an angle servo preamplifier which incorporates solid state circuitry.

A further object of the present invention is to provide an angle servo preamplifier exhibiting a high degree of common mode noise rejection.

Another object of the present invention is to provide an angle servo preamplifier which includes external phase control.

Still another object of the present invention is to provide an angle servo preamplifier which includes a sample and hold stage capable of operating on low millivolt signal levels without adding any significant switching transients.

Yet another object of the present invention is to provide an angle servo preamplifier which incorporates a power amplifier stage capable of amplifying a bipolar signal off a single voltage supply source.

A still further object of the present invention is to provide an angle servo preamplifier exhibiting a minimum linear output range of 80 volts peak-to-peak.

And a still further object of the present invention is to provide an angle servo preamplifier which is capable of stable operation with high capacitance loads.

Yet a still further object of the present invention is to provide an angle servo preamplifier which offers improved performance and enhanced reliability and maintainability over that obtainable by tube-type preamplifier circuits.

Accordingly, to accomplish these and other objects, the present invention provides a solid state angle servo preamplifier for the antenna servo drive system of a precision tracking radar system. The tracking radar system generates a tracking error signal indicative of tracking antenna directional errors (in the azimuth and elevation dimensions) relative to a target. The tracking error signal is fed into the antenna servo drive system which effects the antenna directional corrections required to reposition the tracking antenna on target. The function of the angle servo preamplifier of the present invention is to provide amplification for the tracking error signals from the precision tracking radar system; it comprises, in sequence, an input differential amplifier stage, a phase control stage, a sample and hold stage and a power amplifier stage. In addition, the angle servo preamplifier includes, in front of the power amplifier stage, interfacing circuitry for coupling the preamplifier to the azimuth/secant correction network of the tracking radar system. The sample and hold stage incorporates circuitry for suppressing the switching transients which arise from the sampling of the tracking error signal. The power amplifier stage performs d.c. level translation to accommodate a bipolar tracking error signal off a single voltage supply source.

The tracking radar system incorporates a gated error detector network to generate the tracking error signals indicative of tracking antenna directional errors. The input stage of the angle servo amplifier is coupled to receive the tracking error signal from the gated error detector network. This stage provides low pass filtering together with differential amplification for gain and noise suppression. It also incorporates limiting circuitry for protecting the input stage differential amplifier from switching transients and/or abnormally high input voltages. The tracking error signal is then fed to the phase control stage which comprises circuitry for externally introducing a 180° phase shift.

The amplified tracking error signal (with its either 0° or 180° phase shift) is then coupled to the sample and hold stage, which samples the signal. The sample and hold stage includes an operational amplifier having a negative feedback circuit designed to insure a balanced switching transient is applied to both the inverting and noninverting inputs to the operational amplifier. The balanced switching transients are rejected by the common mode rejection properties of the operational amplifier, effectively "deglitching" the output sampled tracking error signal. This sampled tracking error signal is then coupled to the remaining stage of the angle servo preamplifier through a hybrid power/buffer amplifier capable of driving the high capacitance loads which arise from long runs of shielded cable.

At this point, the portion of the sampled tracking error signal associated with the antenna azimuth dimension is corrected to obtain true azimuth error. This azimuth correction is a function of the secant of the elevation angle, and hence, is designated secant correction. A secant correction network incorporated within the tracking radar system performs this secant correction function on the sampled tracking error signal associated with antenna azimuth error. After secant correcting the sampled tracking error signal associated with the antenna azimuth dimension, the sampled tracking error signal is coupled through the secant correction interface circuitry to the power amplifier stage of the angle servo preamplifier. The interfacing circuitry provides low pass noise filtering together with the high input impedance necessary to effectively isolate the response of this low pass filtering from the following power amplifier stage.

The power amplifier stage of the angle servo preamplifier provides final amplification for the sampled tracking error signal with the capability of driving high capacitance loads. It performs d.c. level translation to permit the amplification of a bipolar sampled tracking error signal while requiring only a single voltage supply source.

The novel features believed to be characteristic of the present invention are set forth in particularly in the appended claims. However, a more complete appreciation of the present invention, both as to organization and mode of operation, and many of the attendant advantages thereof will result as the same becomes better understood by reference to the following detailed description when considered in conjunction with the accompanying drawings.

DESCRIPTION OF THE PREFERRED EMBODIMENT

Figure 1:
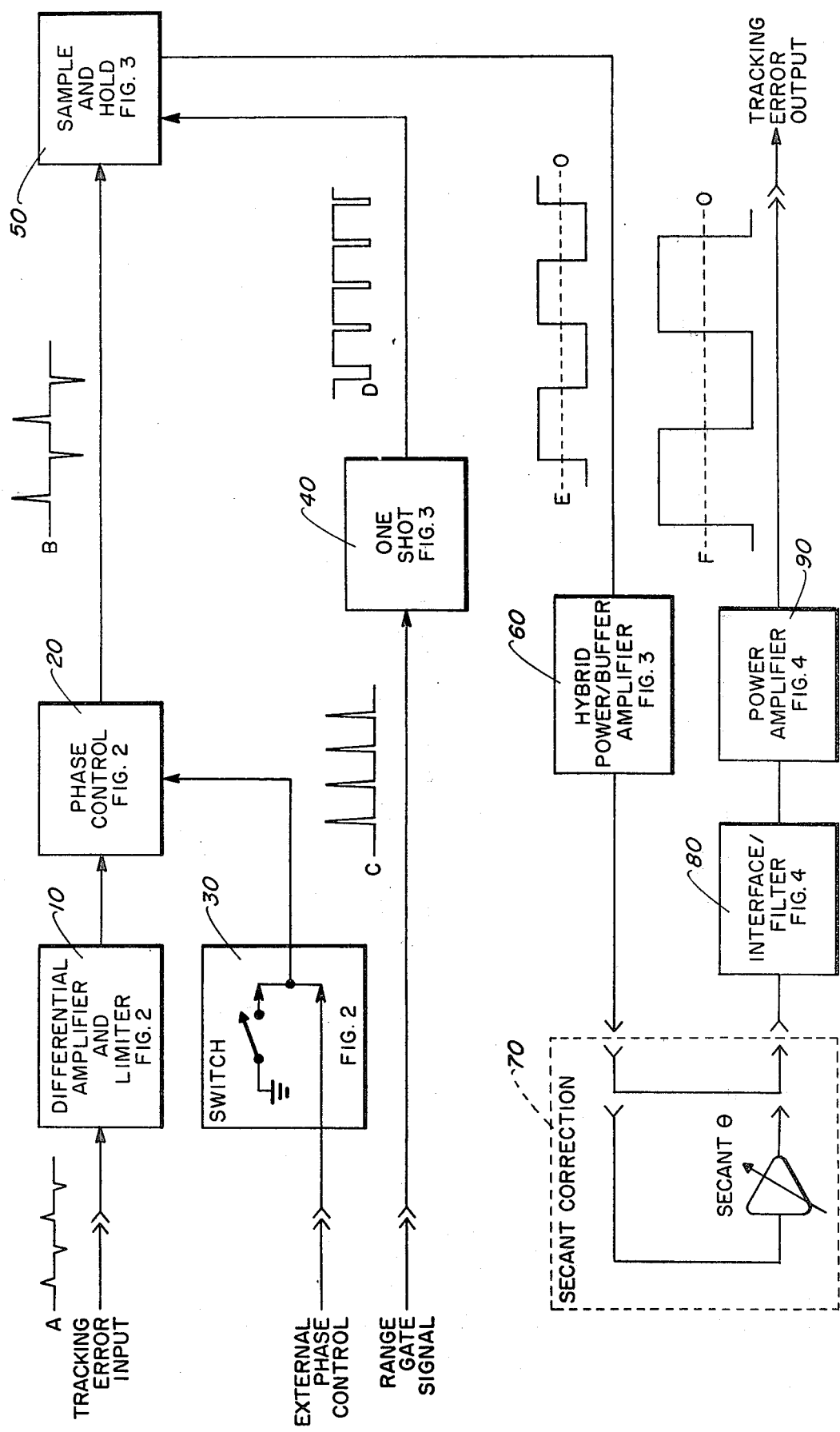
FIG. 1 is a block diagram of the several stages of the angle servo preamplifier in accordance with the present invention. Interposed at various points on the block diagram are sample waveforms A, B, C, D, E and F which are representative of the signals appearing at those points.

The essential function of a precision tracking radar system is to lock a servo driven, narrow-beam tracking antenna onto a target, and continuously repositioning the antenna in both azimuth and elevation to accurately track the position of the target. To perform this dynamic tracking function, the precision tracking radar system includes an antenna servo drive system to control the servo motors driving the tracking antenna. The angle servo preamplifier of the present invention is an integral part of this antenna servo drive system.

The antenna servo drive system and the angle servo preamplifier are responsive to a tracking error signal indicative of tracking antenna directional errors with respect to the target. A tracking error signal is generated by the tracking radar system for both the antenna azimuth and the antenna elevation dimensions. Essentially, a given target is represented in the precision tracking radar system by a target video return signal received by the tracking antenna. A receiver range gain network generates a receiver range gate signal which establishes, in the range dimension, a target range gate locked onto the centroid of the target. The receiver range gate network continuously adjusts the receiver range gate signal to correlate with the return time for the target video return signal. From the configuration of the target video return signal, a gated error detector network, in conjunction with the receiver range gate network, determines whether the tracking antenna manifests a pointing error with respect to the target. If an antenna directional error is detected, the gated error detector network generates a train of bipolar tracking error pulses, synchronized with the receiver range gate signal and correlated to the magnitude of the directional error. This tracking error signal output from the gated error detector network is applied to the antenna servo drive system and the angle servo preamplifier of the present invention.

Generally, a precision tracking radar system incorporates two separate angle tracking channels, one for the azimuth dimension and one for the elevation dimension. Separate portions of the tracking antenna are by design sensitive to target azimuth and target elevation. This allows the precision tracking radar system to separate the target video return signals into antenna azimuth and antenna elevation components, which are processed by respective angle tracking channels. Accordingly, the receiver range gate network and the gated error detector network each comprise an azimuth channel and an elevation channel and the output of the error detector network actually comprises two separate tracking error signals, one for the antenna azimuth error and one for the antenna elevation error.

Accordingly, the ensuing discussion of a preferred embodiment of an angle servo preamplifier for use in the antenna servo drive system of a precision tracking radar system assumes that two separate, although identical, angle servo preamplifiers are required, one for the azimuth channel and one for the elevation channel. For economy of description, however, only one angle servo preamplifier is described and the description is with respect to a tracking error signal undesignated as to the azimuth or elevation dimension. However, except where noted, the following description of a preferred embodiment of the angle servo preamplifier pertains equally in structure, function and operation to either the azimuth channel or the elevation channel of the precision tracking radar system.

In light of the above, and referring now to the drawings wherein like reference characters designate like or corresponding elements throughout the several views, a block diagram of an angle servo preamplifier according to the present invention appears in FIG. 1. The tracking error signal (azimuth or elevation) generated by the gated error detector network (not shown) appears on the tracking error input to the angle servo preamplifier. For the purposes of the ensuing discussion, the input tracking error signal can be represented by a wave shape A comprising alternate positive and negative pulses. However, it will be appreciated by those skilled in the art that the tracking error signal generated by the gated error detector network can vary not only in amplitude and repetition rate but also in phase coding, i.e., the number of positive and negative pulses in a full cycle.

The tracking error signal input to the angle servo preamplifier is applied to a differential amplifier and limiter circuit 10. Differential amplifier and limiter circuit 10 provides initial linear amplification together with low pass filtering and input voltage limiting. Also, noise and transient suppression is afforded by reason of the common mode rejection properties of the differential amplifier in the differential amplifier and limiter circuit. The output of differential amplifier and limiter 10 is applied to phase control circuit 20 which, in addition to providing futher linear amplification for the tracking error signal, permits an externally controlled 180° phase shift to be introduced. The external phase control is provided by means of a switch circuit 30; the switch circuit sets the gain of phase control circuit 20 to be either positive or negative, resulting in a 0° or 180° phase shift. The output of the phase control circuit 20 is represented by a wave shape B.

The amplified tracking error signal (with either a 0° or 180° phase shift) is then sampled by a sample and hold circuit 50. The sampling process is controlled by a one shot circuit 40 which establishes the sample time and synchronizes the sampling process of sample and hold circuit 50 with the input amplified tracking error signal. One shot circuit 40 is clocked by the receiver range gate signal, represented by a wave shape C, from the receiver range gate network (not shown). Since the tracking error signal is synchronized with the receiver range gate signal, this clocking arrangement synchronizes one shot circuit 40, and consequently sample and hold circuit 50, with the tracking error signal. As is developed below, the output of one shot circuit 40 comprises a train of negative going, 20 microsecond pulses (represented by a wave shape D) which is coupled to sample and hold circuit 50. Such sampling signal results in each pulse of the amplified tracking error signal being sampled at or near peak value in the preferred embodiment. In addition to performing the sampling process, sample and hold circuit 50 incorporates circuitry for "deglitching" the sampled tracking error signal output from the sample and hold circuitry by suppressing the switching transients attendent to this sampling process.

Since the amplified tracking error signal input to sample and hold circuit 50 is comprised of both positive and negative pulses, the output sampled tracking error signal closely resembles a bipolar square wave, represented by a wave shape E. This sampled tracking error signal output is applied to a hybrid power/buffer amplifier 60. The hybrid power/buffer amplifier provides the buffering required by the sample and hold stage and is capable of driving the high capacitance loads which arises from long runs of shielded cable.

At this point, the sampled tracking error signal is secant corrected to obtain true antenna azimuth error. For reasons well known in the art, the tracking error signal associated with antenna azimuth must be corrected to obtain a true indication of antenna azimuth error. This azimuth correction is a function of the secant of the elevation angle, hence, the designation secant correction. As is explained more fully below, to obtain true antenna azimuth error the sampled tracking error signal in the azimuth channel angle servo preamplifier is coupled through a secant correction network while the sampled tracking error signal in the elevation channel angle servo preamplifier is coupled through an antenuation matching network. The secant correction and atenuation matching networks, associated with, respectively, the azimuth and elevation channels, are represented generally in FIG. 1 at 70.

Once secant correction is performed, the azimuth channel and the elevation channel sampled tracking error signals are coupled back to respective angle servo preamplifiers. The sampled tracking error signal is applied through an interface/filter circuit 80 to a power amplifier circuit 90. Interface/filter circuit 80 provides isolated low pass filtering. Power amplifier circuit 90 provides high-level, linear amplification for the sampled tracking error signal. In order to operate off a single supply voltage source, power amplifier circuit 90 also performs d.c. level translation. The output of the power amplifier circuit, represented by a wave shape F, comprises the output tracking error signal of the angle servo preamplifier.

Figure 2:
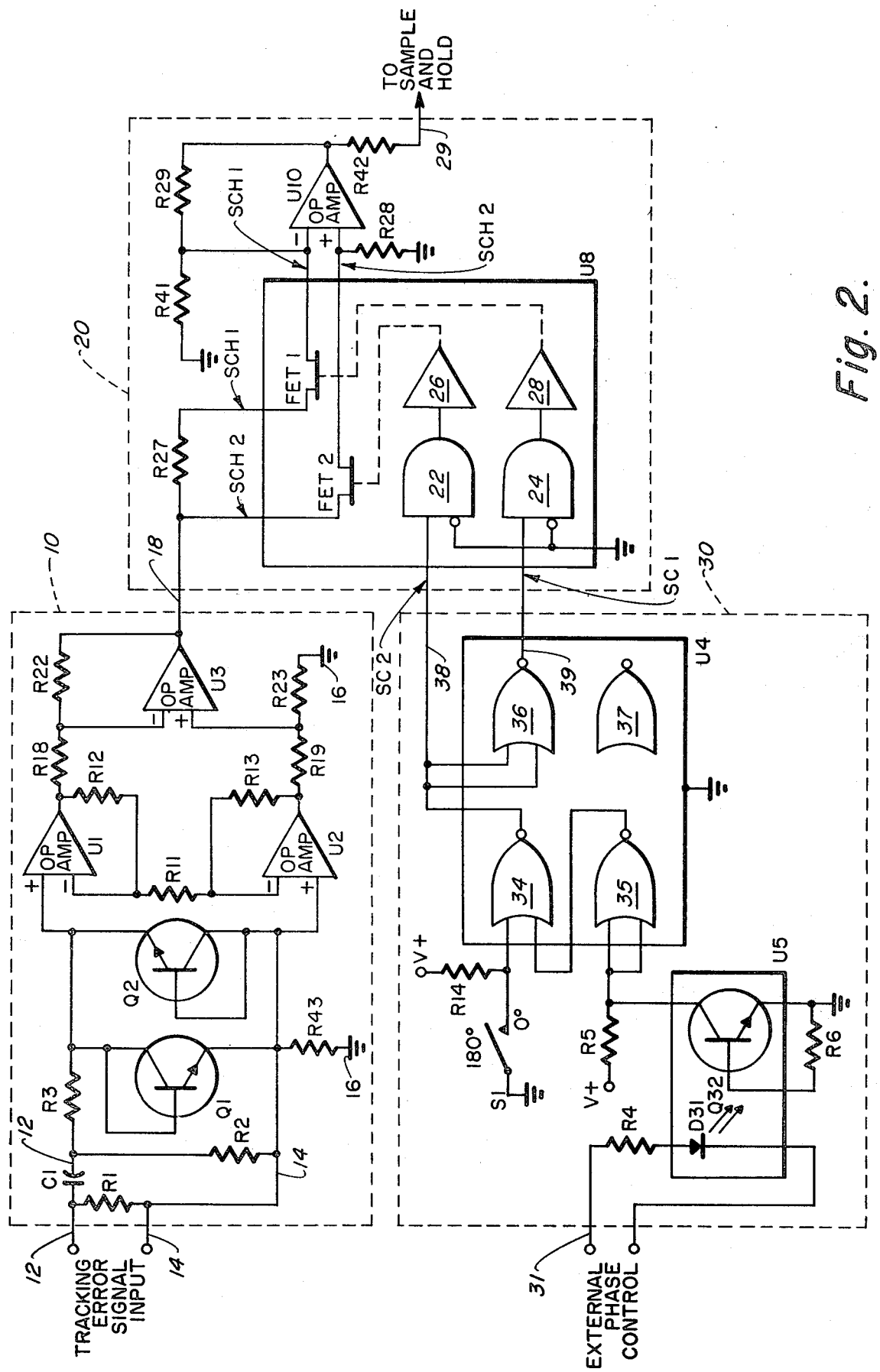
FIG. 2 shows schematic circuit diagrams of those blocks in FIG. 1 representing the differential amplifier and limiter stage, the phase control stage and a switch network associated with the phase control stage.

Considering now a detailed circuit diagram for differential amplifier and limiter circuit 10, FIG. 2 shows the differential amplifier and limiter circuit coupled to receive, via a pair of input lines 12 and 14, the bipolar tracking error signal from the gated error detector network (not shown). An RC filter network comprised of a shunt resistor $R_1$, a series capacitor $C_1$, a shunt resistor $R_2$ and a series resistor $R_3$ is coupled across input lines 12 and 14, while a drain resistor $R_{43}$ is coupled between input line 14 and an isolated ground 16. (The function of isolated ground 16 is explained below.) Transistors $Q_1$ and $Q_2$ are also coupled across input lines 12 and 14; they provide voltage limiting, each being coupled in a "trans-diode" configuration with the base of each transistor being coupled to the collector of the respective transistor.

Differential amplification and common mode noise rejection is provided in differential amplifier and limiter circuit 10 by a floating input differential amplifier comprised of operational amplifiers $U_1$, $U_2$ and $U_3$ together with associated resistors $R_{10}$, $R_{11}$, $R_{12}$, $R_{13}$, $R_{19}$, $R_{22}$ and $R_{23}$. The noninverting inputs to $U_1$ and $U_2$ are coupled to, respectively, input lines 12 and 14 while the inverting inputs are coupled together through resistor $R_{11}$. The output of operational amplifier $U_1$ is coupled, through resistor $R_{10}$, to the inverting input to operational amplifier $U_3$ while the output of operational amplifier $U_2$ is coupled, through resistor $R_{19}$, to the noninverting input to operational amplifier $U_3$. The output of operational amplifier $U_3$, appearing on line 18, comprises the output of differential amplifier and limiter circuit 10.

Differential amplifier and limiter circuit 10 operates as follows. Note that input lines 12 and 14 are not referenced to the ground potential of the angle servo preamplifier, but rather to isolated ground 16. This allows the input tracking error signal from the gated error detector network to be isolated from the angle servo preamplifier ground. Thus, since the differential amplifier (operational amplifiers $U_1$, $U_2$ and $U_3$) of differential amplifier and limiter circuit 10 responds only to potential differences between input lines 12 and 14, the input stage is in effect responding only to signals originating in the gated error detector network. If input line 14 was connected directly to the angle servo preamplifier ground, a ground loop would be introduced with the input tracking error signal, as seen by the angle servo preamplifier, consisting of the tracking error signal in series with the potential difference between the gated error detector ground and the angle servo preamplifier ground.

Resistor $R_1$ provides a d.c. as well as an a.c. load to the output stage of the gated error detector network. The signal developed across resistor $R_1$ is a.c. coupled through capacitor $C_1$ to the differential amplifier (operational amplifiers $U_1$, $U_2$ and $U_3$). The L-section filter comprised of resistor $R_2$ and capacitor $C_1$ provides a high pass filter for establishing the input filter cut-off frequency. In addition, resistor $R_2$ protects transistors $Q_1$ and $Q_2$ from damage should high a.c. voltage be inadvertently applied to input lines 12 and 14. Transistors $Q_1$ and $Q_2$ limit the magnitudes of any transients and/or input voltages appearing on the inputs to operational amplifiers $U_1$ and $U_2$. Limiting transisitors $Q_1$ and $Q_2$, connected in the "trans-diode" configuration, effectively behave like low voltage zener diodes. These limiting transistors clamp the voltage across input lines 12 and 14, and consequently across the inputs to operational amplifiers U$_1$ and U$_2$, to a maximum value of approximately 1.4 volts peak-to-peak. This limiting function has essentially no effect for the normal magnitude range of input tracking error pulses (typically one Vpp or less). Resistor R$_{43}$ operates merely to drain the biasing currents in differential amplifier and limiter circuit 10 when it is not in operation. The value of resistor R$_{43}$ is chosen to be high enough that it appears as essentially an open circuit to the input tracking error signal.

As mentioned above, operational amplifier U$_1$, U$_2$ and U$_3$, together with associated resistors, form a floating input differential amplifier. They amplify the difference in potential applied between the noninverting input of operational amplifier U$_1$ and the noninverting input of operational amplifier U$_2$. The voltage appearing via input line 14 on the noninverting input to operational amplifier U$_2$ is, by reason of the isolated ground connection 16, the ground reference potential of the input tracking error signal from the gated error detector network. And, because of the extremely high input impedance presented by an operational amplifier, the voltage at the noninverting input to operational amplifier U$_1$ is essentially equal to the tracking error signal voltage appearing on input line 12. Thus, straight forward circuit analysis yields the following relationships for the output of operational amplifiers U$_1$ and U$_2$:

$$E_{oU_1} = E_{14} + \left(\frac{R_{12}}{R_{11}} + 1\right)(E_{12} - E_{14}) \quad (1)$$

$$E_{oU_2} = E_{12} + \left(\frac{R_{13}}{R_{11}} + 1\right)(E_{14} - E_{12}) \quad (2)$$

Where E$_{oU}$ and E$_{oU}$ are the output voltages of, respectively, operational amplifiers U$_1$ and U$_2$; E$_{12}$ and E$_{14}$ are the voltages on, respectively, input lines 12 and 14; and R$_{11}$, R$_{12}$, R$_{13}$ and R$_{14}$ are, respectively, the values of resistors R$_{11}$, R$_{12}$, R$_{13}$ and R$_{14}$. Note that, from equations (1) and (2), the common mode (E$_{12}$=E$_{14}$) gain of operational amplifiers U$_1$ and U$_2$ is equal to 1 (E$_{oU}$ =E$_{oU}$ ). By themselves, operational amplifiers U$_1$ and U$_2$ do not perform the rejection of common mode signals. This is the purpose of operational amplifier U$_3$. The outputs of operational amplifier U$_1$, E$_{oU}$ , is coupled to the inverting input to operational amplifier U$_3$; while the output of operational amplifier U$_2$, E$_{oU}$ , is coupled to the noninverting input to operational amplifier U$_3$. If the values of resistors R$_{18}$, R$_{19}$, R$_{22}$ and R$_{23}$ are assumed to be equal, operational amplifier U$_3$ converts the differential outputs of operational amplifiers U$_1$ and U$_2$ into a single output governed by the equation $$E_{oU} = E_{oU} - E_{oU} \quad (3)$$

This equation implies a differential gain of unity and a common mode gain of zero. This, of course, would be equivalent to having a common mode rejection ration (CMRR) of infinity. Actually, resistors R$_{18}$, R$_{19}$, R$_{22}$ and R$_{23}$ typically have a resistance of ±0.1 percent which could yield up to a 0.2 percent spread in their values. Assuming a 0.2 percent resistor mismatch, the common mode rejection ratio of operational amplifier U$_3$ is approximately 60 db. The difference between the differential and common mode gain of operational amplifiers U$_1$ and U$_2$ (typically on the order of 10) adds another 20 db of effective CMRR. The overall differential amplifier comprised of operational amplifiers amplifiers U$_1$, U$_2$, and U$_3$, then, provides a differential gain on the order of 10 while insuring a minimum of approximately 8 0 db of rejection to common mode noise signals.

The amplified tracking error signal from differential amplifier and limiter circuit 10 is coupled via line 18 to phase control circuit 20 (FIG. 2). Phase control circuit 20 comprises an integrated circuit FET switch U$_8$ and an operational amplifier U$_{10}$. FET switch U$_8$ includes a first switching channel defined by an input SCH$_1$, a field effect transistor FET$_1$ *and an output SCH$_1$*, and a second switching channel defined by an input SCH$_2$, a field effect transistor FET$_2$ and an output SCH$_2$. The conducting state of FET$_1$, and hence the switching of the first switching channel of FET switch U$_8$, is controlled by means of a switching signal coupled to the gate of FET$_1$ through a switch control input SC$_1$, and AND gate 24 and a driver 28. Similarly, the state of FET$_2$, and hence the switching of the second switching channel of FET switch U$_8$, is controlled by means of a switching signal coupled to the gate of FET$_1$ through a switch control input SC$_2$, and AND gate 22 and a driver 26. The output of differential amplifier and limiter circuit 10, i.e., of operational amplifier U$_3$, is coupled, via line 18, through a resistor R$_{27}$ to input SCH$_1$ to FET switch U$_8$, and directly to input SCH$_2$ to FET switch U$_8$. Outputs SCH$_1$ and SCH$_2$ of FET switch U$_8$ are coupled to, respectively, the inverting and noninverting inputs to operational amplifier U$_{10}$. As is explained below, operational amplifier U$_{10}$ together with associated resistors R$_{28}$, R$_{29}$, R$_{41}$ and R$_{42}$, can form either a noninverting or an inverting amplifier depending on which of the switching channels of FET switch U$_8$ is selected to be in the "ON" state. The output of operational amplifier U$_{10}$, coupled through a resistor R$_{42}$, appears on line 22 and comprises the output of phase control circuit 20.

The switching of FET switch U$_8$ is controlled by switch circuit 30, coupled via lines 39 and 38 to, respectively, control inputs SC$_1$ and SC$_2$ to FET switch U$_8$. A detailed circuit diagram of switch circuit 30 appears in FIG. 2, showing a mechanical switch S$_1$, an opto-isolator switch U$_5$ and a control logic circuit U$_4$. Switch S$_2$ has an open position designated "180°" and a closed position designated "0°". Opto-isolator switch U$_5$ includes a photo-diode D$_{31}$ and an optical transistor Q$_{32}$. An external phase control input line 31 is coupled through a resistor R$_4$ to photo-diode D$_{31}$. The base of optical transistor Q$_6$ is coupled through a resistor R$_6$ to ground while the collector of optical transistor Q$_{32}$ is coupled through a resistor R$_5$ to a positive bias supply.

Control logic circuit U$_4$ includes three NOR gates 34, 35 and 36, interconnected as follows. The two inputs to NOR gate 35 are coupled to the collector of optical transistor Q$_{32}$ while the output of NOR gate 35 is coupled to one of the two inputs to NOR gate 34. The second input to NOR gate 34 is coupled to a positive bias supply through a resistor R$_{14}$ and to ground through switch S$_1$. The output of NOR gate 34 is coupled via line 38 to control input SC$_2$ to FET switch U$_8$. Both of the inputs of NOR gate 36 are coupled to the output of NOR gate 34, thus inverting the output of NOR gate 34, while the output of NOR gate 36 is coupled via line 39 to control input SC$_1$ to FET switch U$_8$.

The operation of the phase control circuit 20 together with switch circuit 30 is as follows. The amplified tracking error signal from differential amplifier and limiter circuit 10 is applied via line 18 to inputs $SCH_1$ and $SCH_2$ to FET switch $U_8$. FET switch $U_8$ is a two channel, high-speed FET switch designed to operate with TTL level (5 volt) logic. Thus, when a TTL level "high" is applied to control input $SC_1$, $FET_1$ is driven into conduction and the first switching channel of FET switch $U_8$ is "open"; conversely, when a TTL level "low" is applied to control input $SC_1$, the first switching channel is effectively an open circuit. The operation of the second switching channel of FET switch $U_8$ (control input $SC_2$ and $FET_2$) is identical. As is explained below, the TTL level on control input $SC_1$ is constrained by the operation of switch circuit 30 to be the complement of the TTL level at control input $SC_2$. Thus, only one switching channel of FET switch $U_8$ can be on at any one time.

Considering the case where the first switching channel of FET switch $U_8$ is switched on, and consequently the second switching channel is off, the amplified tracking error signal appearing on line 18 is applied through resistor $R_{27}$ and $FET_1$ to the inverting input to operational amplifier $U_{10}$. The noninverting input to operational amplifier $U_{10}$ is essentially at ground potential which then holds the summing junction at the inverting input to operational amplifier $U_{10}$ also essentially at ground. Resistor $R_{41}$ then has zero volts applied to each end and so has no effect on the circuit operation. The remaining resistors associated with operational amplifier $U_{10}$ then form a standard inverting amplifier configuration having a negative gain. In this mode, phase control circuit 20 introduces a 180° phase shift to the amplified tracking error signal.

On the other hand, when the second switching channel of FET switch $U_8$ is on and the first switching channel is off, the amplified tracking error signal appearing on line 18 is coupled through $FET_2$ to the noninverting input to operational amplifier $U_{10}$. In this case, resistor $R_{28}$ is of no consequence and the remaining resistors associated with operational amplifier $U_{10}$ then form a standard noninverting amplifier configuration with the output gain being positive. In this mode, the amplified tracking error signal is merely amplified by phase control circuit 20 without introducing a phase shift.

As noted above, the switching states of the first and second switching channels of FET switch $U_8$ are determined by the TTL levels on the control inputs ($SC_1$ and $SC_2$) to the FET switch. These TTL level inputs, in turn, are determined by switch circuit 30. Specifically, the TTL level appearing on the output of NOR gate 34 is coupled via line 38 to control input $SC_2$ of FET switch $U_8$ while the TTL level appearing at the output of NOR gate 36 is coupled via line 39 to control input $SC_1$ of FET switch $U_8$. And, since NOR gate 36 inverts the output of NOR gate 34, control inputs $SC_1$ and $SC_2$ are always complements of each other.

Considering, now, the switching operation of switch circuit 30 (FIG. 2), switch $S_1$ is (in the preferred embodiment) located at the angle servo preamplifier and provides for the manual selection of phase. When switch $S_1$ is in the open or "180°" position, the resulting logic level high on the input to NOR gate 34 results in a TTL level "low" at the output of NOR gate 34 irrespective of the logic level appearing on the second input to NOR gate 34. This TTL level low is applied via line 38 to control input $SC_2$ to FET switch $U_8$ while the complement TTL level high is applied to control input $SC_1$, switching on the first switching channel of FET switch $U_8$. This couples the amplified tracking error signal from differential amplifier and limiter circuit 10 through the first switching channel of FET switch $U_8$ ($FET_1$) to the inverting input to operational amplifier $U_{10}$, functioning in this mode as a standard inverting amplifier. Accordingly, phase control circuit introduces a 180° phase shift to the amplified tracking error signal.

If, on the other hand, switch $S_1$ is placed in the closed or "0°" position, the TTL level output of switch circuit 30 is determined by the logic level appearing on the one of the inputs to NOR gate 34 which is coupled to the output of NOR gate 35. The output of NOR gate 35 is determined by the optoisolater switch $U_5$ which, in turn, is controlled by an external phase control input applied on line 31. (The function of the opto-isolater switch $U_5$ is to isolate the angle servo preamplifier ground from the noisy external phase control line.) In the preferred embodiment, a remotely controlled d.c. voltage can be applied to external phase control input line 31, driving optical transistor $Q_{32}$ into conduction, grounding its collector and applying a logic level low to both inputs to NOR gate 35. This results in a TTL level high appearing on the output of NOR gate 35, with a TTL level low appearing on the output of NOR gate 34, and on control input $SC_1$ to FET switch $U_8$, while a complement TTL level high appears on control input $SC_2$. Thus, the second switching channel of FET switch $U_8$ is switched on and, consequently, a 180° phase shift is introduced to the amplified tracking error signal. In the absence of such an external phase control input on line 31, optical transistor $Q_{32}$ is nonconducting and a logic level high is applied to both inputs to NOR gate 35. This results in a TTL level high at the output of NOR gate 35 and at the output of NOR gate 34. This TTL level high is applied via line 38 to control input $SC_2$ to FET switch $U_8$, resulting in the second switching channel of FET switch $U_8$ being switched on. This couples the amplified tracking error signal from differential amplifier and limiter circuit 10 through the second switching channel of FET switch $U_8$ ($FET_2$) to the noninverting input to operational amplifier $U_{10}$, in this mode functioning as a standard noninverting amplifier with a positive (0° phase shift) gain.

Figure 3:
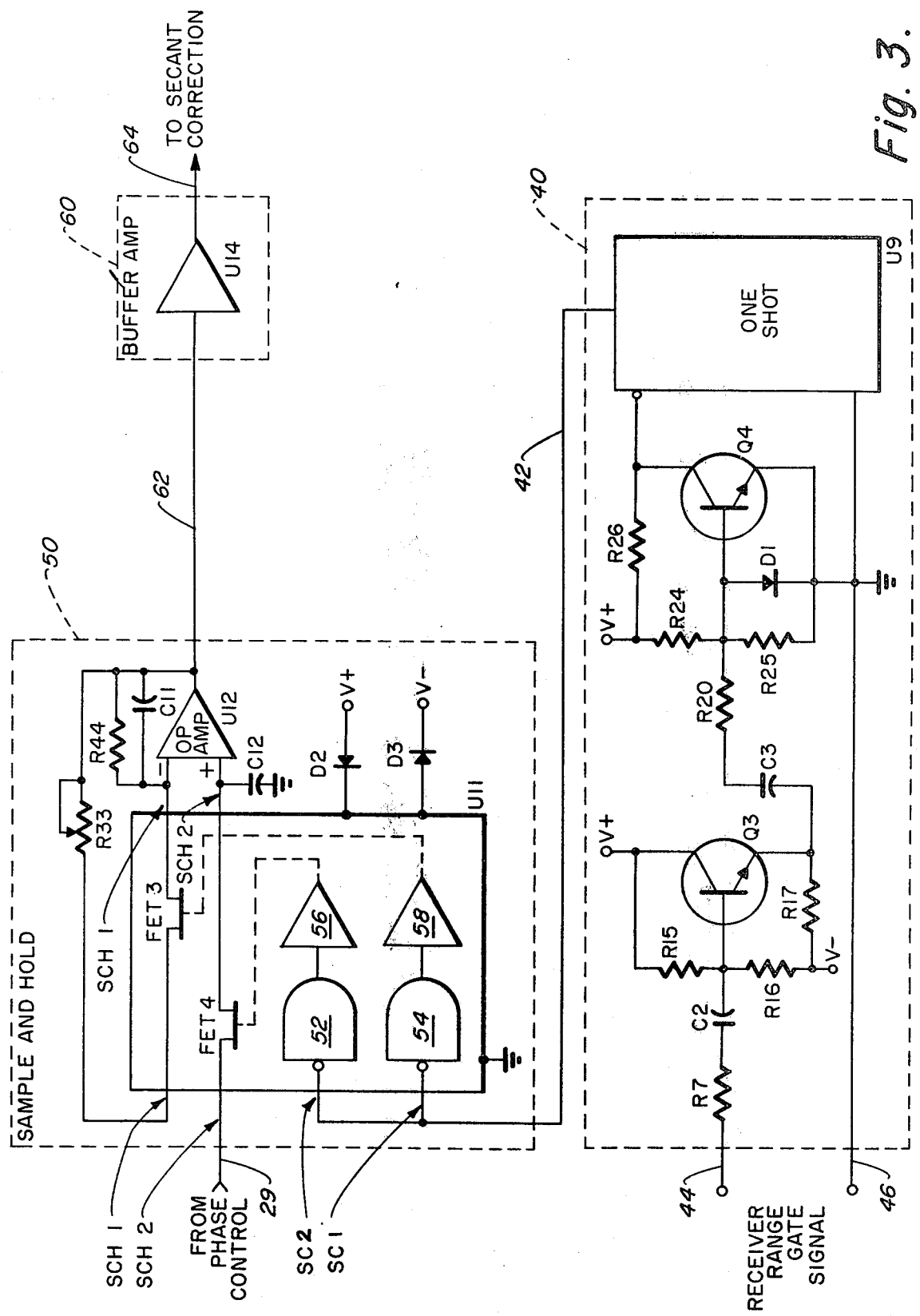
FIG. 3 shows schematic circuit diagrams of those blocks in FIG. 1 representing the sample and hold stage, the oneshot stage and a hybrid power/buffer amplifier network.

As stated above, the amplified tracking error signal appearing on the output of operational amplifier $U_{10}$ (with either a 0° or 180° phase shift) is coupled through resistor $R_{42}$ and appears on line 22, forming the output of phase control circuit 20. The amplified tracking error signal is then applied, via line 22, to sample and hold circuit 50. Referring to the detailed circuit diagrams in FIG. 3 of sample and hold circuit 50 together with one shot circuit 40, sample and hold circuit 50 comprises an integrated circuit, high-speed FET switch $U_{11}$ and an FET operational amplifier $U_{12}$. FET switch $U_{11}$ includes a first switching channel defined by an input $SCH_1$, a field effect transistor $FET_3$ and an output $SCH_1$, and a second switching channel defined by an input $SCH_2$, a field effect transistor $FET_4$, and an output $SCH_2$. The state of $FET_3$, and hence the switching of the first switching channel of FET switch $U_{11}$ is controlled by means of a switching signal coupled to the gate of $FET_3$ through a switch control input $SC_1$, and AND gate 54 and a driver 58. Similarly, the state of $FET_4$, and hence the switching of the second switching channel of FET switch $U_{11}$, is controlled by means of a switching signal coupled to the gate of $FET_4$ through a switch control input $SC_2$, an AND gate 22 and a driver 26. FET switch $U_{11}$ is coupled to FET operational amplifier $U_{12}$, with outputs $SCH_1$ and $SCH_2$ being coupled to, respectively, the inverting and noninverting inputs to the operational amplifier. The control inputs $SC_1$ and $SC_2$ to FET switch $U_{11}$ are coupled via a line 42 to one shot circuit 40.

Operational amplifier $U_{12}$ together with a holding capacitor $C_{12}$ and feedback capacitor $C_{11}$ comprise a standard sample and hold configuration. In addition, sample and hold circuit 50 inorporates a resistor $R_{44}$ and a potentiometer $R_{33}$ together with the first switching channel of FET switch $U_{11}$ into the negative feedback loop of operational amplifier $U_{12}$. Thus, the output of operational amplifier $U_{12}$ is coupled to the inverting input to operational amplifier through the parallel combination of capacitor $C_{11}$, resistor $R_{44}$, and potentiometer $R_{33}$ in series with the first switching channel of FET switch $U_{11}$ (as defined by input $SCH_1$, $FET_3$ and output $SCH_1$). As is developed below, potentiometer $R_{33}$ together with $FET_3$ function to suppress the swiching transients attendant to the sampling process, effectively deglitching the output waveform of operational amplifier $U_{12}$. The output of operational amplifier $U_{12}$ comprises the output of sample and hold stage 50.

The switching of FET switch $U_{11}$, and thereby the sampling process performed by sample and hold circuit 50, is controlled by one shot circuit 40. Referring to the circuit diagram shown in FIG. 3, one shot circuit 40 comprises an integrated circuit, 12 microsecond one-shot $U_9$ together with a pair of transistors $Q_3$ and $Q_4$ which together comprise the triggering network for the one-shot. A positive voltage supply is coupled directly to the collector and through a resistor $R_{15}$ to the base of transistor $Q_3$ while a negative supply voltage is coupled through a resistor $R_{16}$ to the base and through a resistor $R_{17}$ to the emitter of transistor $Q_3$. The output appearing on the emitter of transistor $Q_3$ is coupled through a capacitor $C_3$ and a resistor $R_{20}$ to the base of transistor $Q_4$. The biasing network of transistor $Q_4$ includes resistors $R_{24}$, $R_{25}$ and $R_{26}$ and a diode $D_1$. The collector of transistor $Q_4$ is coupled to the trigger input to one-shot $U_9$.

The mode of operation of sample and hold circuit 50 together with one shot circuit 40 is as follows. The amplified tracking error signal from phase control circuit 20 is applied via line 29 to the second switching channel (input $SCH_2$) of FET switch $U_{11}$. The switching of the second (and the first) switching channel, and therefore the sampling of the input amplified tracking error signal, is determined by the TTL level switching signal generated by one shot circuit 40 and coupled via line 42 to control inputs $SC_1$ and $SC_2$ to FET switch $U_{11}$.

Considering one shot circuit 40, one shot $U_9$ generates a train of switching pulses in response to triggering pulses from the triggering network comprised of transistors $Q_3$ and $Q_4$. The receiver range gate signal from the receiver range gate network (not shown) is applied via line 44 to the base of transistor $Q_3$. Transistor $Q_3$ together with associated elements form a high speed, high input impedance buffer amplifier to amplify the receiver range gate signal. The amplified output appearing on the emitter of transistor $Q_3$ is applied to transistor $Q_4$. Transistor $Q_4$ together with associated elements provide some additional gain and, in addition, perform the interface to the standard TTL level triggering voltages required by one-shot $U_9$. Together, transistors $Q_3$ and $Q_4$ provide a trigger pulse to one-shot $U_9$ for each of the pulses of the receiver range gate signal.

The output of one-shot $U_9$ is a TTL level high until triggered by a trigger pulse. For reasons explained below, the one-shot by design incorporates a 12 microsecond time constant. Thus, the trigger pulses applied to one-shot $U_9$ by the triggering network (transistors $Q_3$ and $Q_4$) result in a train of negative-going, TTL level low pulse outputs, each with a duration of 12 microseconds. And, since the generation of the tracking error signal in the gated error detector network is synchronized to the receiver range gate signal, triggering one-shot $U_9$ off the receiver range gate signal effectively synchronizes the sampling process performed by sample and hold circuit 50 with the input amplified tracking error signal.

The TTL level low pulse output from one-shot $U_9$ is applied via line 42 to both control inputs $SC_1$ and $SC_2$ to FET switch $U_{11}$. Since the control inputs are inverted at, respectively, AND gates 54 and 52, the first and second switching channels of FET switch $U_{11}$ are in the conducting state only when TTL level low pulses are applied. Thus, each time one-shot $U_9$ is triggered to a TTL level low state, both switching channels of FET switch $U_{11}$ are switched to the conducting state. The two switching channels remain conducting for 12 microseconds, the duration of each TTL level low pulse. In the preferred embodiment, each of the tracking error pulses that comprise the tracking error signal from the gated error detector network attains peak value in approximately 12 microseconds. Thus, since the arrival of the TTL level low switching pulses are synchronized to the receiver range gate signal, and consequently to the amplified tracking error signal, the above sampling process is designed to insure that each of the tracking error pulses is sampled at or near peak value.

The sampling output from the second switching channel ($FET_4$) of FET switch $U_{11}$ appears on output $SCH_2$ and is applied to holding capacitor $C_{12}$ and to the noninverting input to operational amplifier $U_{12}$. Holding capacitor $C_{12}$ and the input impedance of operational amplifier $U_{12}$ (FIG. 3) form a holding network having a time constant long in comparison with the sampling time of FET switch $U_{11}$. In addition to the sampling output appearing on the noninverting input to operational amplifier $U_{12}$, a switching output appears concurrently on the inverting input to the operational amplifier via the first switching channel ($FET_3$) of FET switch $U_{11}$ which is constrained to be conducting during the time the first switching channel is conducting. This switching output is applied to the inverting input to operational amplifier $U_{12}$. By design and fabrication, the field effect transistor in the first switching channel of FET switch $U_{11}$, $FET_3$, exhibits an approximately 20 percent larger charge transfer during switching than the field effect transistor in the second switching channel ($FET_4$). $FET_3$ is fabricated in this manner, and included within the feedback loop of operational amplifier $U_{12}$, to compensate for the unavoidable charge transfer which takes place during the switching attendant to the sampling process. Effectively, this configuration for sample and hold circuit 50 applies a balance switching transient to both the inverting and noninverting inputs to operational amplifier $U_{12}$. If these transients are in fact equal, they will be rejected by reason of the common mode rejection properties of operational amplifier $U_{12}$. Potentiometer $R_{33}$ is used as a "fine tuning" adjustment to the charge transfer balance. It is adjusted for a minimum "glitch" or switching transient in the sampled tracking error signal output of operational amplifier $U_{12}$. In this manner, sample and hold stage 50 is capable of performing sample and hold operations on low-millivolt input tracking error pulse levels without adding any significant switching glitches to the output waveform.

The diodes $D_2$ and $D_3$ and resistor $R_{44}$ (see FIG. 3) are included to insure the stability of operational amplifier $U_{12}$. Diodes $D_2$ and $D_3$ provide protection against the latch-up of operational amplifier $U_{12}$ during power turn-on and/or in the presence of transients. Resistor $R_{44}$ is included in the feedback loop of operational amplifier $U_{12}$ to improve stability during the time $FET_3$ and $FET_4$ are "off" (non-conducting). The value of resistor $R_{44}$ is chosen to be significantly greater than the value of potentiometer $R_{33}$ and thus has a negligible effect on the sampling process.

The sample tracking error signal appearing on the output of operational amplifier $U_{12}$ comprises the output of the sample and hold circuit 50. Since the amplified tracking error signal input to sample and hold circuit 50 is comprised of both positive and negative pulses, the output sampled tracking error signal closely resembles a square wave. This sampled tracking error signal is applied via a line 62 to hybrid power/buffer circuit 60. Hybrid power/buffer circuit 60 comprises a power/buffer amplifier $U_{14}$ (see FIG. 3) which provides the buffering required by sample and hold circuit 50 and, in addition, is capable of driving the highly capacitive loads which arise from long runs of shielded cable. The output of power/buffer amplifier $U_{14}$ appears on line 64.

At this point in the preferred embodiment, the azimuth channel sampled tracking error signal is secant corrected to obtain the true azimuth tracking error. A schematic, functional representation of this secant correction process appears in FIG. 4 at 70. Essentially, the azimuth channel sampled tracking error signal is routed out of the azimuth channel angle servo preamplifier and through a secant correction network 72, comprised of a secant correction pot 76. Concurrently, the elevation channel sampled tracking error signal is routed out of the elevation channel angle servo preamplifier and through an elevation attenuation network 74, comprised of a pair of resistors $R_8$ and $R_9$.

As noted above, to obtain the true azimuth tracking error, the azimuth channel sampled tracking error signal must be attenuated by amount correlated to the elevation angle of the tracking antenna as a function of the secant of that elevation angle. The function of secant correction network 72 is to introduce, for any given elevation angle, such a secant-correlated amount of attenuation so as to obtain the true azimuth tracking error. Secant pot 76 embodies this secant-correlated attenuation function. (The use of a secant pot in secant correction network 72 is acceptable although a solid state secant correction network is to be preferred.)

The function of elevation attenuation network 74 is to match the attenuation in the elevation channel to the attenuation in secant correction network 72 for an elevation angle of zero degrees. This attenuation matching equalizes the gain of the two channels at 0° elevation. At 0° elevation, the secant is zero and no correction is necessary to obtain the true azimuth tracking error. For elevation angles above 0° the secant-correlated attenuation of secant pot 76 increases with a resulting attenuation mismatch between secant correction network 72 and elevation attenuation network 74. The attenuation mismatch produces the necessary secant correction to the azimuth channel sampled tracking error signal to obtain the true azimuth tracking error.

Figure 4:
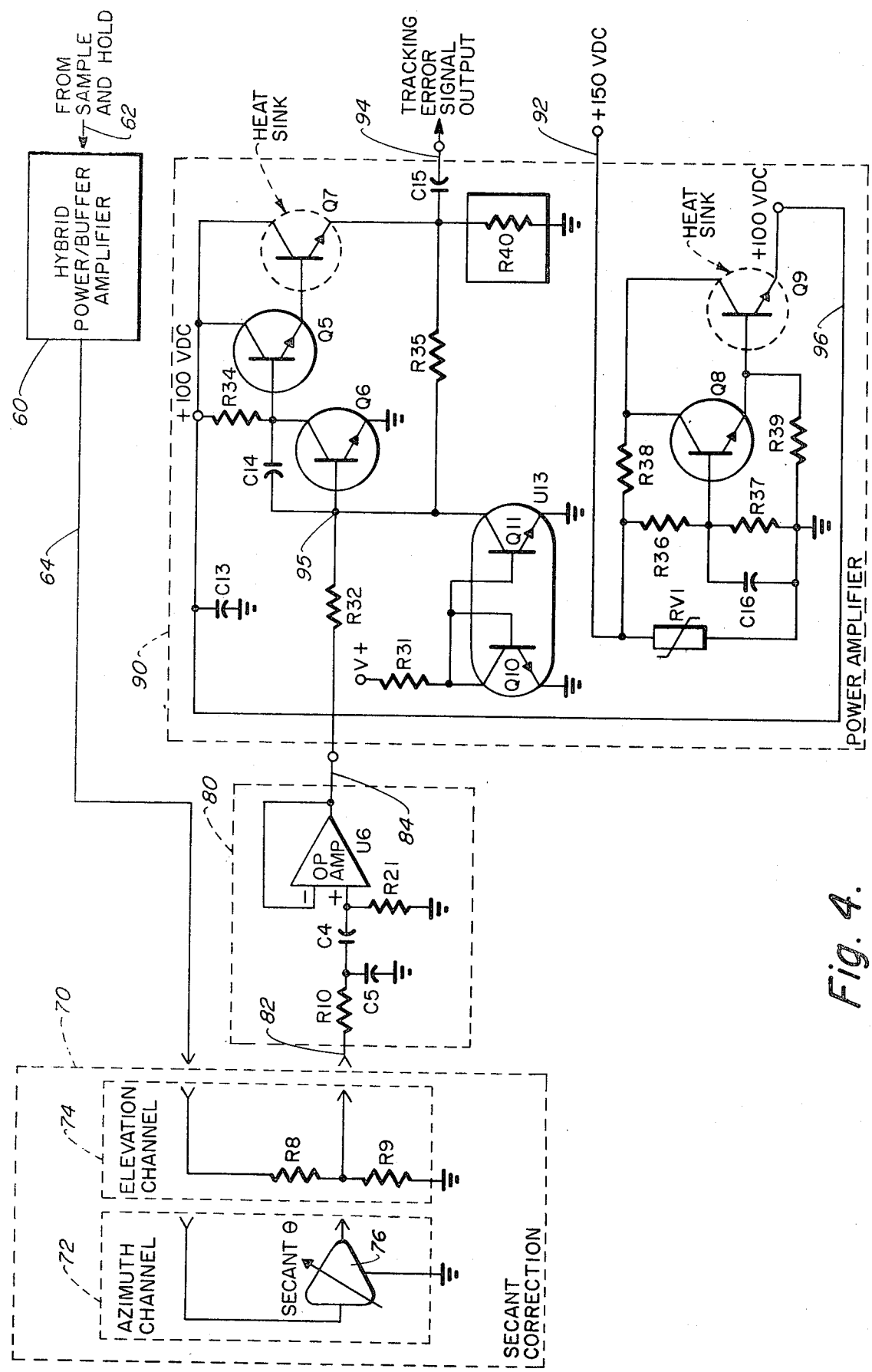
FIG. 4 shows schematic circuit diagrams of those blocks in FIG. 1 representing the interface/filter circuitry and the power amplifier stage. Also shown is a schematic representation of the secant correction network.

After secant correction in the azimuth channel and attenuation matching in the elevation channel, the azimuth channel and elevation channel sampled tracking error signals are coupled back into the respective angle servo preamplifier. Referring to FIG. 4, the respective sample tracking error signal (azimuth or elevation) appears on a line 82 and is applied to interface/filter circuit 80.

Interface/filter circuit 80 comprises an RC low pass filtering network together with an FET operational amplifier $U_6$. The sampled tracking error signal appearing on line 82 is coupled through the RC filtering network comprised of a series resistor $R_{10}$, a shunt capacitor $C_5$, a series capacitor $C_4$ and a shunt resistor $R_{21}$, to the noninverting input to operational amplifier $U_6$. Operational amplifier $U_6$ is a high input impedance, FET operational amplifier connected in the voltage follower mode. In operation, resistors $R_{10}$ and $R_{21}$ together with capacitor $C_5$ form a low pass filter with some attenuation for the sampled tracking error signal. The high impedance this filter presents to low frequency signals is necessary for tracking radar systems which incorporate a secant correction network that utilizes a secant pot to provide secant correction in the azimuth channel. This high impedance termination on input line 82 is more vulnerable to noise pickup (hence the low pass filter) but required in order to maintain the functional accuracy of the secant pot. The input impedance into the noninverting input to FET operational amplifier $U_6$ is several orders of magnitude higher than the impedance level of the low pass filter. This effectively isolates the filter response of interface/filter circuit 80 from the following power amplifier stage. The output of FET operational amplifier $U_6$ appears on line 84 and comprises the output of interface/filter circuit 80.

At this point, the sampled tracking error signal is essentially a bipolar, low frequency square wave. The signal is fed via line 84 to power amplifier circuit 90 for final, high level amplification in the angle servo preamplifier. Referring to the detailed circuit diagram in FIG. 4, a 150 v d.c. supply source is coupled through voltage regulator circuitry comprised of transistors $Q_8$ and $Q_9$ to the amplifying circuitry of power amplifier circuit 90. The amplifying circuitry for the power amplifier circuit is comprised of amplifying transistors $Q_5$, $Q_6$ and $Q_7$ together with a matched transistor pair $U_{13}$ connected as a "current mirror" constant current source. The voltage regulator circuitry functions as a single supply voltage source for the amplifying circuitry. Accordingly, since the input signal to the power amplifier stage is a bipolar signal, power amplifier circuit 90 must perform d.c. level translation. The purpose of the matched transistor pair is to provide the necessary d.c. level translation.

The voltage regulator circuitry of power amplifier circuit 90 provides a highly stable 100 v d.c. (in the preferred embodiment) source of voltage supply. A 150 v d.c. voltage source is coupled via a line 92 to a varistor $RV_1$ and through a resistor $R_{38}$ to the collectors of transistors $Q_8$ and $Q_9$. An RC biasing and filtering network (resistors $R_{36}$ and $R_{37}$ and a capacitor $C_{16}$) is coupled to the base of transistor $Q_8$ while biasing resistor $R_{39}$ is coupled to the base of transistor $Q_9$. The emitter of transistor $Q_8$ is coupled to the base of transistor $Q_9$.

The 100 V d.c. output of the voltage regulator circuitry appears on the emitter of transistor $Q_9$ and is coupled via a line 96 to the amplifier circuitry of power amplifier circuit 90. A shunt capacitor $C_{13}$ provides an a.c. path to insure amplifier stability.

The 100 V d.c. voltage supply on line 96 is coupled to each of the collectors of amplifying transistors $Q_5$, $Q_6$ through a resistor $R_{34}$) and $Q_7$. The sampled tracking error signal appearing on line 84 is coupled through a resistor $R_{32}$ to the base of transistor $Q_6$. The collector and a base of transistor $Q_6$ are coupled together through a capacitor $C_{14}$; the collector of transistor $Q_6$ is also coupled to the base of transistor $Q_5$. The emitter of transistor $Q_5$ is coupled to the base of transistor $Q_7$ while the emitter of transistor $Q_7$ is coupled through a feedback resistor $R_{35}$ to the base of transistor $Q_6$ and through a resistor $R_{40}$ to ground.

In addition to the amplifying transistors $Q_5$, $Q_6$ and $Q_7$, the amplifier circuitry of power amplifier circuit 90 includes matched transistor pair $U_{13}$ comprised of a pair of closely matched translations transistors $Q_{10}$ and $Q_{11}$. The matched transistor pair form a "current mirror" constant current source with the collector of transistor $Q_{10}$ being coupled to a positive bias supply, through a resistor $R_{31}$, while the bases of transistors $Q_{10}$ and $Q_{11}$ are coupled together and to the collector of transistor $Q_{10}$. The collector of transistor $Q_{11}$ is coupled to the base of transistor $Q_6$.

The mode of operation of power amplifier circuit 90 is as follows. Considering, first, the voltage regulator circuitry, varistor $RV_1$ provides protection to regulator transistors $Q_8$ and $Q_9$ against the transients which can appear on the 150 v d.c. input line 92, by changing very rapidly from a high impedance state to a low impedance state and absorbing the transient energy. Capacitor $C_{16}$ provides further filtering for any ripple or transients. Resistor $R_{38}$ limits the maximum current available to the amplifying circuitry of power amplifier circuit 90, providing protection during short circuit conditions. In addition, resistor $R_{38}$ and transistor $Q_9$ dissipate a significant amount of power which would otherwise have to be dissipated by the amplifier circuitry of power amplifier circuit 90. As a result, amplifying transistors $Q_5$, $Q_6$ and $Q_7$ operate cooler, enhancing their reliability. The regulated 100 v d.c. which appears in the preferred embodiment on the emitter of transistor $Q_9$ is coupled via line 96 to the amplifier circuitry of the power amplifier stage.

The d.c. level translation required to accommodate the single supply voltage source is provided by means of matched transistor pair $U_{13}$ which functions in power amplifier circuit 90 as a constant current source. Matched transistor pair $U_{13}$ comprises a monolithic pair of accurately matched transistors. The current in any transistor is given by the equation $$I_c = I_s \exp(V_{BE}/KT/q) \quad (4)$$

where K is Boltzman's constant; q is the charge of an electron; T is the temperature in degrees kelvin; $V_{BE}$ is the base to emitter voltage; $I_s$ is the reverse saturation current; and $I_e$ is the emitter current. Because of the sharing of the same bulk material which is characteristic of monolithic devices, the temperature T can be assumed to be equal for both transistors ($Q_{10}$ and $Q_{11}$) of matched transistor pair $U_{13}$. And, with the bases of matched transistors $Q_{10}$ and $Q_{11}$ being coupled together, the base-to-emitter voltages ($V_{BE}$) of both transistors are constrained to be identical. The reverse saturation current $I_s$ is a function of device geometries and construction techniques; using monolithic techniques, this parameter can be closely matched. Thus, having made everything on the right side of equation (4) very nearly equal (the parameters K and q being constant), it follows that the emitter currents of the two transistors are also very nearly equal. In practice, the emitter currents are found to match typically within a coupled percent or less. Now, knowing that $V_{BE}$ for each of matched transistors $Q_{10}$ and $Q_{11}$ is approximately 0.65 volts, the emitter current of transistor $Q_{10}$ can be set to any desired value by the proper selection of resistor $R_{31}$. And, once the emitter current of transistor $Q_{10}$ is set by resistor $R_{31}$, this same current flows through transistor $Q_{11}$, irrespective of the voltage across the collector-to-emitter junction of transistor $Q_{11}$. Thus, matched transistor pair $U_{13}$ operates as "mirror" constant current source.

The function of the constant current source formed by matched transistor pair $U_{13}$ is to control the output d.c. translation level voltage appearing at the output of power amplifier circuit 90 (the emitter of transistor $Q_7$). This effect of the constant current source on d.c. circuit operation can be illustrated by first considering the case where the input voltage is zero and examining the currents flowing into and out of circuit node 95. (For the purpose of this discussion, current flow is considered to be conventional in direction, i.e., from a positive voltage node to more negative voltage node.) Since the emitter of transistor $Q_6$ is grounded, the voltage at the base of transistor $Q_6$ is simply the base-to-emitter drop of the transistor (approximately 0.6 volts). This voltage appears across resistor $R_{32}$, inducing a small current flowing out of circuit node 95. A small current also flows out of circuit node 95 into the base of transistor $Q_6$. Note that this current is determined by the collector current of transistor $Q_6$ which is essentially the current flowing through resistor $R_{34}$, a constant. Thus, the current flowing out of circuit node 95 and into the base of transistor $Q_6$ remains essentially constant. And, as explained above, the constant current source formed by matched transistor pair $U_{13}$ introduces a constant current flow out of circuit node 95 which is independent of the voltage at the node, being dependent only upon the value of resistor $R_{31}$. Summarizing, constant currents flow out of circuit node 95 through resistor $R_{32}$, into the base of transistor $Q_6$, and into the collector of the transistor $Q_{11}$. Since no d.c. current flows through capacitor $C_{14}$, the only other possible source of current to satisfy Kirchoff's current law is through resistor $R_{35}$; and the current through $R_{35}$ determines the voltage at the emitter of transistor $Q_7$, i.e., the output voltage of power amplifier circuit 90. From the above, the influence of the constant current source formed by the matched transistor pair $U_{13}$ on the output d.c. translation level is apparent. By the choice of resistors $R_{31}$, $R_{32}$ and $R_{35}$, the d.c. current flow through resistor $R_{35}$ can be determined and, consequently, the d.c. voltage at the emitter of transistor $Q_7$, i.e., the output of power amplifier circuit 90, can be established. This output d.c. translation level can be shifted to any desired level without changing either the d.c. or a.c. gain, simply by changing the value of resistor $R_{31}$. This changes the amount of current drawn through constant current source $U_{13}$ and hence causes a different current to flow through resistor $R_{35}$. Note that this output voltage could also be changed by simply changing the value of the resistor $R_{35}$. However, this would also change the gain of the circuit. In summary, constant current source $U_{13}$ enables the independent control of gain and quiescent operating point, thus achieving the proper amplification together with the desired d.c. translation level.

Now, to illustrate how the interface with the bipolar sampled tracking error signal is achieved in power amplifier circuit 90, consider the case where the input voltage appearing on line 84 goes positive. The current through resistor $R_{32}$ is decreased, and actually reverses when the input exceeds the base-to-emitter voltage drop of transistor $Q_6$. This feeds current into circuit node 95, the current required to be supplied through resistor $R_{35}$ is less, the voltage drop across resistor $R_{35}$ is less, and, hence, the output voltage drops. Conversely, when the input goes negative, more current flows out of circuit node 95 through resistor $R_{32}$. More current is required to be supplied through resistor $R_{35}$ to balance this, resulting in a rise in output voltage. Accordingly, even though power amplifier circuit 90 operates off only a single positive supply, it can be directly coupled to a bipolar signal.

Consider now the a.c. operation of the power amplifier circuitry of power amplifier circuit 90. As stated above, the sampled tracking error signal input to the power amplifier stage is essentially a low frequency square wave. For such an input, d.c. coupling is desirable to eliminate the problems of excessive droop, due to low frequency roll-off, attendant to a.c. coupling. Accordingly, the sample tracking error signal appearing on line 84 is d.c. coupled through resistor $R_{32}$ to the amplifier circuitry of the power amplifier stage.

For an a.c. analysis, constant current source $u_{13}$ can be ignored because of the fact that it exhibits very high output impedance. The remainder of the amplifier circuitry of power amplifier circuit 90 is then recognized as a direct coupled amplifier utilizing negative feedback to stabilize both the quiescent operating point and the d.c. and a.c. gain. Transistors $Q_5$, $Q_6$ and $Q_7$ form an inverting amplifier similar to a single ended operational amplifier. Resistor $R_{35}$ is the feedback resistor, resistor $R_{32}$ the input resistor, and the gain of the circuit is determined by their ratio. Capacitor $C_{14}$ is used to establish a dominant pole in the open loop response of the amplifier. It adds to the feedback capacitance of transistor $Q_6$ and is then multiplied by the gain of that stage due to the Miller effect. This greatly increases its effect on the high frequency roll-off of power amplifier circuit 90. This, in turn, serves to suppress high frequency noise spikes and prevent noise induced oscillation. Thus, when the feedback loop is closed, excess phase shift is avoided and the stability of the power amplifier stage is assured even when driving high capacitance loads.

The output of power amplifier circuit 90 appears on the emitter of transistor $Q_7$ and is coupled through a capacitor $C_{15}$ to appear on a line 94 comprising the output of the angle servo preamplifier according to the present invention. Typical output voltages which are obtainable in the preferred embodiment are on the order of 100 volts peak-to-peak.

Obviously, other embodiments and modifications of the present invention will readily come to those of ordinary skill in the art having the benefit of the teachings presented in the foregoing description and the drawings. It is therefore to be understood that this invention is not to be limited thereto and that said modifications and embodiments are intended to be included within the scope of the appended claims.

What is claimed is:

1. A sample and hold circuit receiving an input signal, comprising:
   a. sampling switch means coupled to receive said input signal;
   b. an operational amplifier having inverting and noninverting inputs coupled to said sampling switch means;
   c. feedback means coupled to said operational amplifier;
   d. a holding capacitor coupled to the noninverting input to said operational amplifier; said holding capacitor acquiring substantially the peak amplitude level of each sampled portion of said input signal; said holding capacitor in combination with the input impedance of said operational amplifier comprising an RC circuit with a time constant long in comparison with the sampling time of said sampling switch means;
   e. said sampling switch means comprising an FET switch which comprises:
      (1) first switching channel defined by a field effect transistor incorporated within said feedback means;
      (2) a second switching channel defined by a second field effect transistor being coupled to receive said input signal and coupled to the noninverting input to said operational amplifier; and
      (3) first and second control paths responsive to sample control pulses to switch into conduction, respectively, said first and second field effect transistors; said field effect transistors being otherwise nonconducting;
      (4) said first field effect transistor exhibiting a significantly larger charge transfer during switching than said second field effect transistor; and
   sampling control means for providing the sample control pulses; said sampling control means being coupled to both said first and second control paths such that said first and second switching channels are constrained to switch on or off simultaneously; said first switching channel in combination with said feedback means applying a switching transient to the inverting input to said operational amplifier which balances the switching transient appearing on the noninverting input to said operational amplifier via said second switching channel; the balanced switching transients being suppressed by reason of the common mode rejection properties of said operational amplifier, thereby deglitching the sampling output from said sample and hold circuit;
   f. said sampling switch means in combination with said operational amplifier being operable to suppress any significant switching transients attendant to the sampling process.

2. The sample and hold circuit as recited in claim 1 wherein said sampling control means comprises:
   a. a trigger network for generating trigger pulses synchronized with said input signal; and
   b. a one-shot circuit responsive to the trigger pulses to generate a sample control pulse for each trigger pulse; the sample control pulses being thereby synchronized with said input signal.

3. The sample and hold circuit as recited in claim 2 wherein said feedback means comprises:
   a. a feedback capacitor coupled between the output of and the inverting input to said operational amplifier; and b. a potentiometer coupled to the output of and, through said first switching channel, to the inverting input to said operational amplifier;
c. said potentiometer controlling the switching transient appearing on the inverting input to said operational amplifier such that a minimum switching glitch appears in the sampling output from said sample and hold circuit.

* * * * *